(12) United States Patent
Parikh et al.

(10) Patent No.: US 9,184,333 B2
(45) Date of Patent: Nov. 10, 2015

(54) CONTACT AND INTERCONNECT METALLIZATION FOR SOLAR CELLS

(71) Applicant: Applied Materials, Inc., Santa Clara, CA (US)

(72) Inventors: Suketu Arun Parikh, San Jose, CA (US); Jen Shu, Saratoga, CA (US); James M. Gee, Albuquerque, NM (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 53 days.

(21) Appl. No.: 13/791,067

(22) Filed: Mar. 8, 2013

(65) Prior Publication Data

US 2013/0288424 A1    Oct. 31, 2013

Related U.S. Application Data

(60) Provisional application No. 61/639,055, filed on Apr. 26, 2012.

(51) Int. Cl.
*H01L 31/0224* (2006.01)
*H01L 31/18* (2006.01)
(Continued)

(52) U.S. Cl.
CPC ...... *H01L 31/1864* (2013.01); *H01L 21/67155* (2013.01); *H01L 31/02167* (2013.01); *H01L 31/022425* (2013.01); *H01L 31/068* (2013.01); *H01L 31/1804* (2013.01); *Y02E 10/547* (2013.01); *Y10T 29/41* (2015.01)

(58) Field of Classification Search
CPC ............................................. H01L 31/022425
USPC ......................................................... 438/98
See application file for complete search history.

(56) References Cited

U.S. PATENT DOCUMENTS

2003/0102022 A1\* 6/2003 Fath et al. ...................... 136/256
2009/0039513 A1\* 2/2009 Fath et al. ...................... 257/751
(Continued)

FOREIGN PATENT DOCUMENTS

JP    2000261012 A    9/2000
JP    2002289889 A    10/2002
(Continued)

OTHER PUBLICATIONS

International Search Report dated Jun. 27, 2013 for PCT Application No. PCT/US2013/03000.

*Primary Examiner* — Victor A Mandala
*Assistant Examiner* — Regan J Rundio
(74) *Attorney, Agent, or Firm* — Patterson & Sheridan, LLP

(57) ABSTRACT

A fabrication line includes a texturizing module configured to texture a substrate, an emitter module configured to form an emitter region, a passivation layer module configured to form a passivation layer, a barrier contact module configured to form a barrier contact region, a firing module configured to anneal the barrier contact region, a top metal contact module configured to form a top metal contact region, and a soldering module configured to solder the barrier contact region to the top metal contact region. The modules are integrated by one or more automated substrate handlers into a single fabrication line. A method for fabricating a solar cell includes sequentially, in an automated fabrication line: doping a dopant in a substrate; disposing a passivation layer; disposing and annealing a barrier metal paste to form a barrier contact; and disposing and annealing a metal contact paste to form a top metal contact region.

13 Claims, 7 Drawing Sheets

(51) Int. Cl.
*H01L 21/67* (2006.01)
*H01L 31/0216* (2014.01)
*H01L 31/068* (2012.01)

(56) References Cited

U.S. PATENT DOCUMENTS

| | | | |
|---|---|---|---|
| 2010/0015751 A1* | 1/2010 | Weidman et al. | 438/72 |
| 2010/0156353 A1* | 6/2010 | Iyer et al. | 320/137 |
| 2010/0248413 A1* | 9/2010 | Strand et al. | 438/67 |
| 2011/0185851 A1* | 8/2011 | Kaneko et al. | 75/343 |
| 2011/0284068 A1* | 11/2011 | Moslehi et al. | 136/256 |
| 2012/0058632 A1* | 3/2012 | Abbott et al. | 438/542 |
| 2012/0178200 A1* | 7/2012 | Stewart | 438/57 |
| 2012/0180860 A1* | 7/2012 | Ko et al. | 136/256 |
| 2012/0270359 A1* | 10/2012 | Kumar et al. | 438/71 |
| 2013/0118573 A1* | 5/2013 | Adachi et al. | 136/256 |

FOREIGN PATENT DOCUMENTS

| | | |
|---|---|---|
| JP | 2004238670 A | 8/2004 |
| JP | 2009193993 A | 8/2009 |
| JP | 2012019047 A | 1/2012 |

* cited by examiner

TO

FROM
FIG. 3F
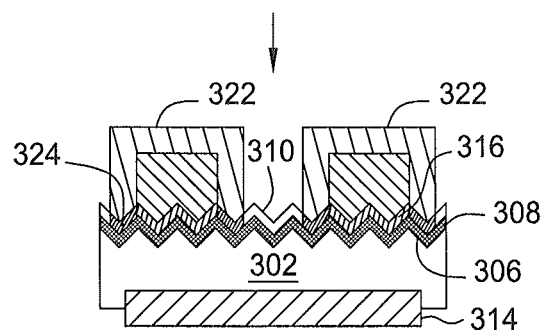
FIG. 3G
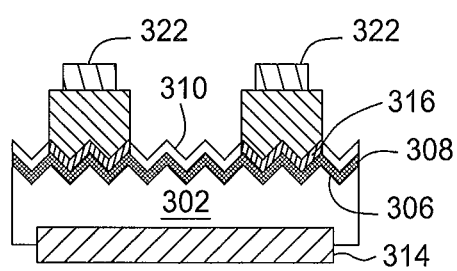
FIG. 3H

CONTACT AND INTERCONNECT METALLIZATION FOR SOLAR CELLS

RELATED APPLICATIONS

This application claims priority to U.S. Patent Application Ser. No. 61/639,055, filed on Apr. 26, 2012, which is incorporated by reference in its entirety.

BACKGROUND OF THE INVENTION

1. Field of the Invention

Embodiments of the present invention generally relate to a fabrication line and process sequence for forming contact and interconnect metallization for solar cells, and solar cells formed by same.

2. Description of the Related Art

Solar cells are photovoltaic devices that convert sunlight directly into electrical power. The most common solar cell material is silicon, which is in the form of single or multicrystalline substrates, sometimes referred to as substrates. Because the amortized cost of forming silicon-based solar cells to generate electricity is higher than the cost of generating electricity using traditional methods, there has been an effort to reduce the cost required to form solar cells.

Conventional silicon solar cells, such as crystalline-silicon solar cells, use a metal based contact structure for the front-surface current collection and for the rear surface contacting areas. Contact resistivity between the metal contact structures and the substrate is always desired to be low so as to maintain good electrical performance of the solar cells. Improvements to the fabrication of the metal contact assist in reducing manufacturing costs.

Therefore, there exists a need for improved methods to form the metal contact structures and interconnect structures formed on a surface of a substrate to form a solar cell with desired electric performances as well as a low manufacture cost.

SUMMARY OF THE INVENTION

A fabrication line, a method for forming a solar cell, and solar cells are provided. A fabrication line for solar cell manufacturing includes a texturizing module, an emitter module, a passivation layer module, a barrier contact module, a firing module, a top metal contact module, and a soldering module. The texturizing module is configured to texture a substrate. The emitter module is configured to receive the substrate from the texturizing module and to form an emitter region on the substrate. The passivation layer module is configured to receive the substrate form the emitter module and to form a passivation layer on the emitter region. The barrier contact module is configured to receive the substrate form the passivation layer module and anneal a barrier contact region on the substrate. The barrier contact module is configured to receive the substrate from the barrier contact module and anneal the barrier contact region on the substrate. The top metal contact module is configured to receive the substrate from the firing module and form a top metal contact region on the barrier contact region. The soldering module is configured to solder the barrier contact region to the top metal contact region. The modules are integrated by one or more automated substrate handlers into a single fabrication line.

In another embodiment, a method for fabricating a solar cell includes, sequentially in an automated fabrication line, doping a dopant in a substrate and disposing a passivation layer on the substrate. The method also includes disposing a barrier metal paste on the substrate and annealing the barrier metal paste to form a barrier contact region. The method further includes disposing a top metal contact paste on the barrier contact region, and annealing the top metal contact paste to form a top metal contact region.

In yet another embodiment, a barrier metal paste includes a metal particle having a nitride layer disposed around the metal particle and a solvent.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3A-3H depict cross-sectional views of a solar cell substrate during different fabrication stages of the processing sequence of FIG. 2 using the fabrication line of FIG. 1 according to one embodiment of the present invention;

Figure 1:
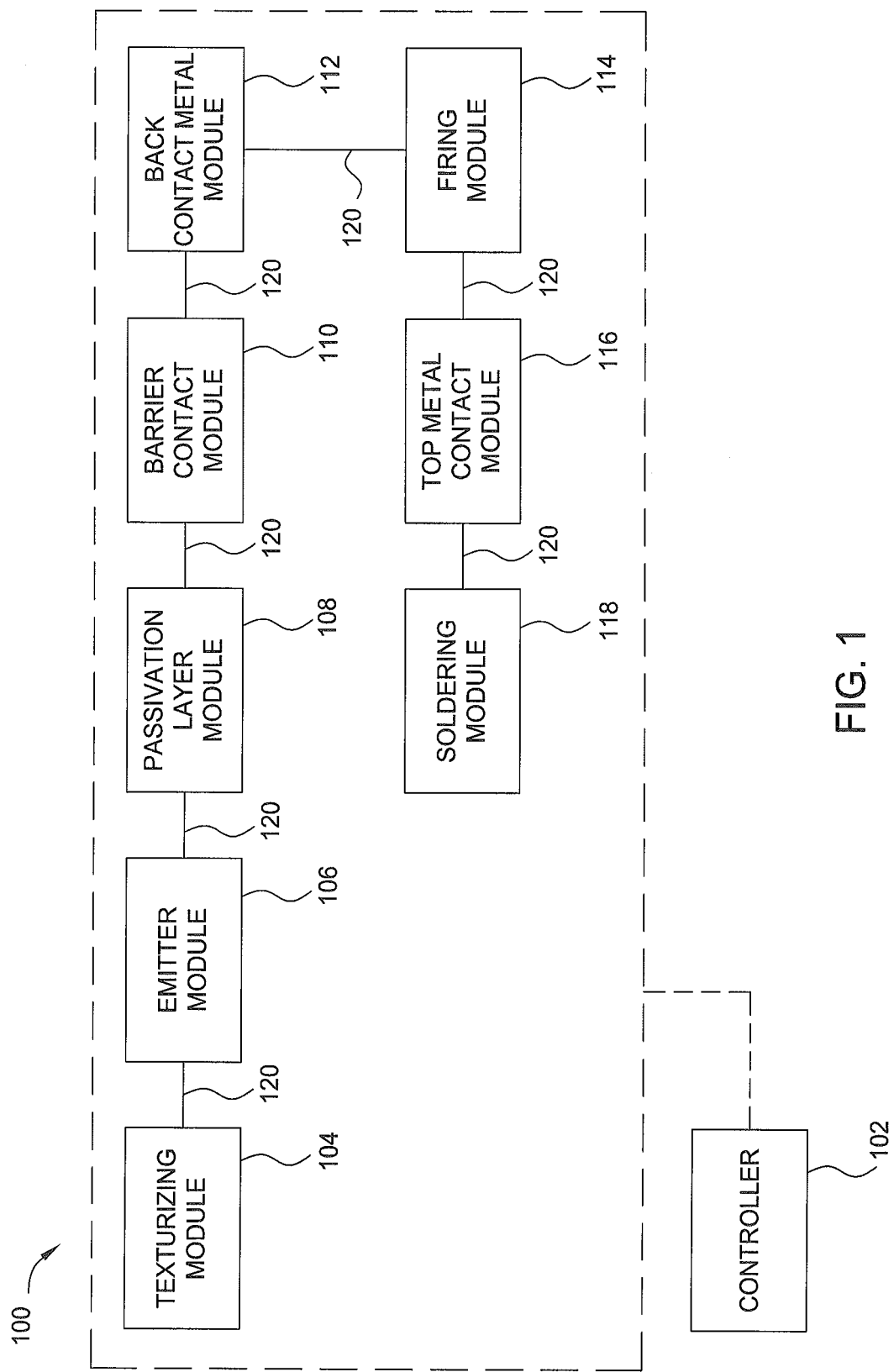
FIG. 1 depicts a fabrication line suitable to form solar cells in accordance with one embodiment of the present invention.

To facilitate understanding, identical reference numerals have been used, where possible, to designate identical elements that are common to the figures. It is also contemplated that elements and features of one embodiment may be beneficially incorporated on other embodiments without further recitation.

DETAILED DESCRIPTION

Figure 2:
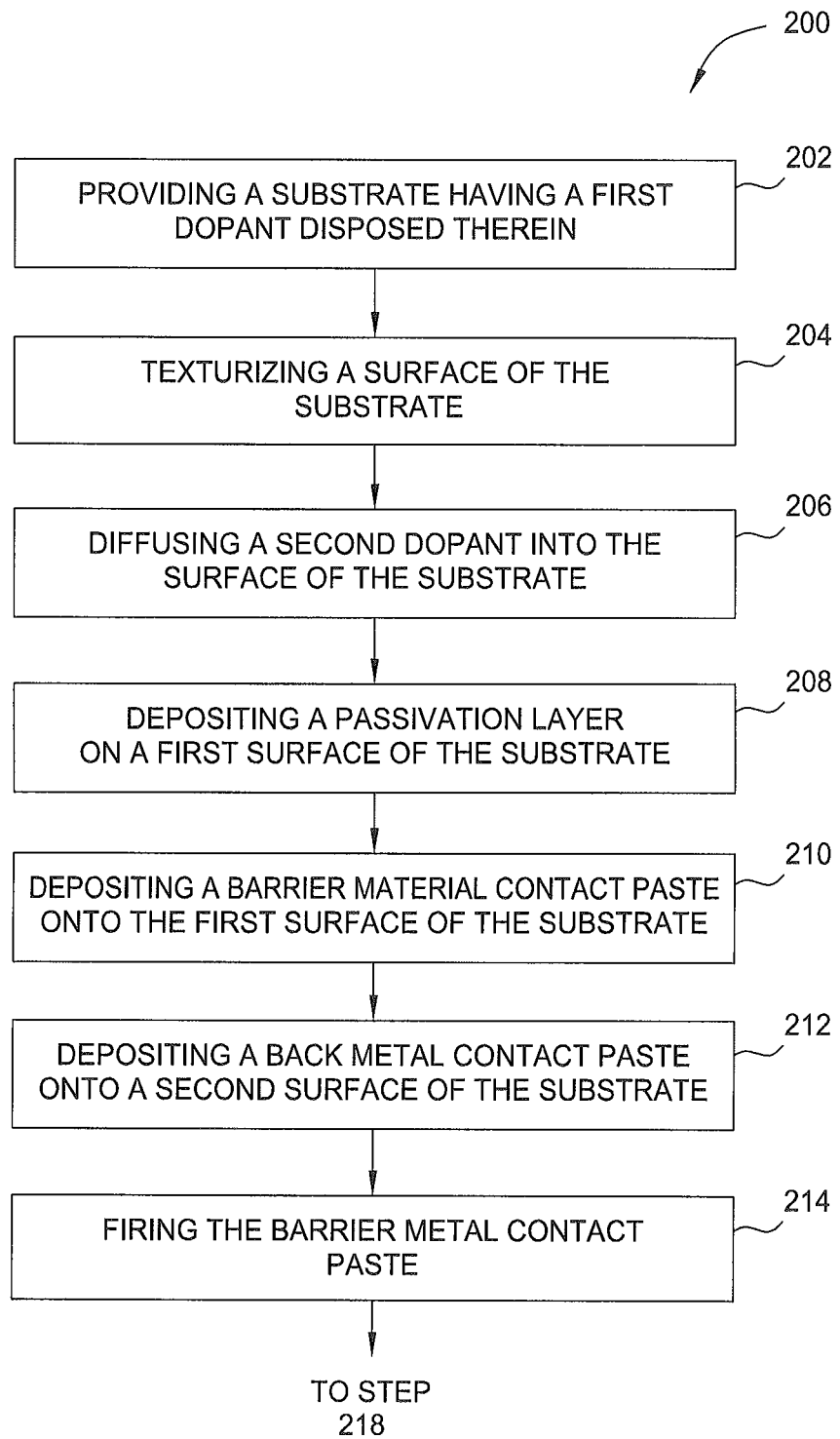
FIG. 2 depicts a block diagram of a processing sequence that may be practiced using the fabrication line of FIG. 1 according to one embodiment of the present invention.
Figure 2:
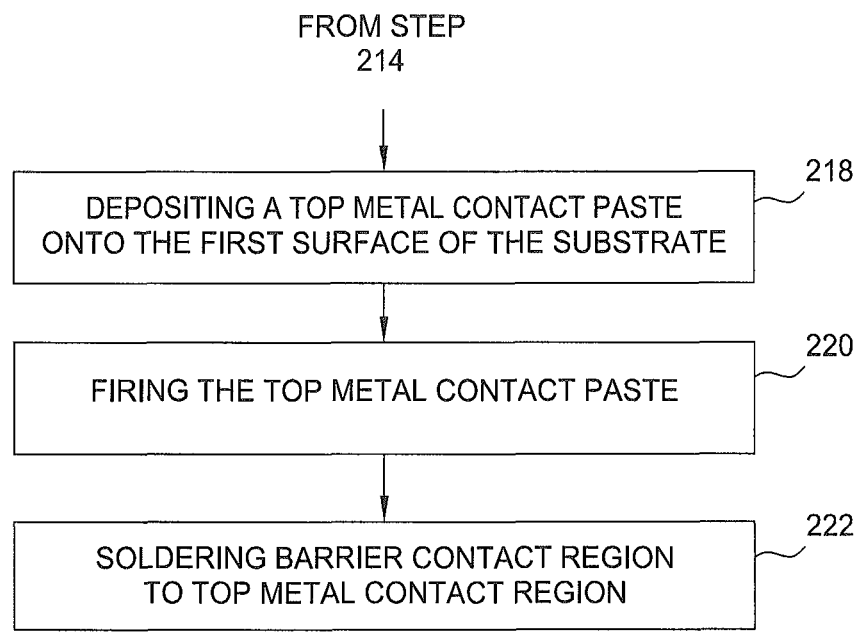

FIG. 1 depicts a fabrication line 100 used to form a solar cell in accordance with one embodiment of the present invention. FIG. 2 depicts a block diagram of a processing sequence 200 that may be practiced using the fabrication line of FIG. 1 according to one embodiment of the invention. In one embodiment of the invention, the fabrication line is automated. FIGS. 3A-3H depict cross-sectional views of a solar cell substrate during different fabrication stages of the processing sequence of FIG. 2 according to one embodiment of the invention. It is noted that the fabrication line in FIG. 1 and processing sequences depicted in FIG. 2 are only an example of a process flow that can be used to manufacture a solar cell. Additional modules and blocks may be added in between the modules and blocks depicted in FIGS. 1 and 2, respectively, as needed to form a desirable solar cell. Optionally, one or more cleaning processes may be performed at one or more points in the processing sequence in an optional cleaning module. Similarly, some modules and blocks depicted herein may also be eliminated as needed. It is contemplated that one or more metal or dielectric layers formed on a back side of a substrate may be formed at any desired stage as needed.

A system controller 102 facilitates the control and automation of an overall fabrication line 100 and may include a central processing unit (CPU) (not shown), memory (not shown), and support circuits (or I/O) (not shown). The CPU may be one of any form of computer processors that are used in industrial settings for controlling various chamber processes and hardware (e.g., conveyors, optical inspection assemblies, motors, fluid delivery hardware, etc.) and monitor the system and chamber processes (e.g., substrate position, process time, detector signal, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 102 determines which tasks are performable on a substrate. The program is readable by the system controller 102, which includes code to generate and store at least substrate positional information, the sequence of movement of the various controlled components, substrate optical inspection system information, and any combination thereof.

The fabrication line 100 includes one or more automated substrate handles 120. The automated substrate handlers 120 may be one or more conveyors, robots, or palletized tracks configured to transfer a substrate sequentially or asequentially through the modules of the fabrication line 100 described further below. In the embodiment, as depicted in FIGS. 1, 2 and 3A-3H, the process starts at block 202 by providing a substrate 302 having dopants disposed in one or more surfaces of the substrate 302 in a texturizing module 104. The substrate 302 may be a single crystal or multicrystalline silicon substrate, silicon containing substrate, doped silicon containing substrate, amorphous silicon substrate, copper indium gallium (di)selenide substrate, gallium arsenide substrate, cadmium telluride substrate or other suitable substrates. In one embodiment, the substrate 302 is a doped silicon containing substrate with p-type dopants disposed therein. In one embodiment, the substrate 302 is a p-type crystalline silicon (c-Si) substrate. P-type dopants used in silicon solar cell manufacturing are chemical elements, such as, boron, aluminum or gallium. In another embodiment, a crystalline silicon substrate 302 may be an electronic grade silicon substrate or a low lifetime, defect-rich silicon substrate, for example, an upgraded metallurgical grade (UMG) crystalline silicon substrate. The upgraded metallurgical grade (UMG) silicon is a relatively clean polysilicon raw material having a low concentration of heavy metals and other harmful impurities, for example in the parts per million range, but which may contain a high concentration of boron or phosphorus, depending on the source. In certain applications, the substrate can be a back-contact silicon substrate prepared by emitter wrap through (EWT), metallization wrap around (MWA), or metallization wrap through (MWT) approaches. Although the embodiment depicted herein and relevant discussion thereof primarily discuss the use of a p-type c-Si substrate, this embodiment is not intended to be limiting as to the scope of the invention. The emitters formed over the substrate will vary based on the type of substrate that is used, as will be discussed below.

Figure 3A:
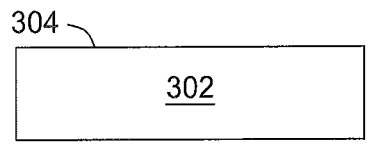
Figure 3B:
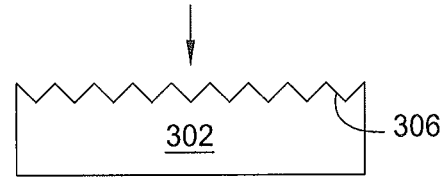

At block 204, the substrate 302 is textured in the texturizing module 104. The texturing process roughens a front side 304 of the substrate 302 to form a textured surface 306, as shown in FIG. 3B. The textured surface 306 on the front side of the solar cell substrate 302 is adapted to receive sunlight after the solar cell has been formed. The textured surface 306 is formed to enhance light trapping in the solar cells to improve conversion efficiency. In one example, the substrate 302 is etched in an etching solution comprising about 2.7% by volume of potassium hydroxide (KOH) and about 4500 ppm of 300 MW polyethylene glycol (PEG) that is maintained at a temperature of about 79-80° C. for about 30 minutes. In one embodiment, the etching solution for etching a silicon substrate may be an aqueous potassium hydroxide (KOH), sodium hydroxide (NaOH), aqueous ammonia ($NH_4OH$), tetramethylammonium hydroxide (TMAH; or $(CH_3)_4NOH$), or other similar basic solution. The etching solution will generally anisotropically etch the substrate 302, forming pyramids on the textured surfaces 306 of the substrate 302.

Figure 3C:
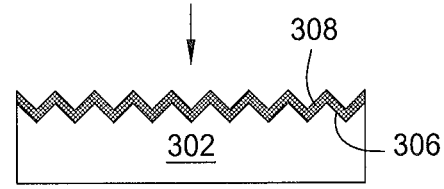

At block 206, as shown in FIG. 3C, a dopant material, such as a doping gas, is used to form an emitter region 308 (e.g., n+ doped region or p+ doped region) on the textured surface 306 of the solar cell substrate 302 in an emitter module 106. In one embodiment, the emitter region 308 is formed in the substrate 302 by use of a gas phase doping process. In one embodiment, the emitter region 308 is between about 50 Å and about 20 µm thick and comprises an n-type dopant atom.

In one embodiment, at block 206, dopants in a doping gas, provided from a deposition module of the emitter module 106, are diffused into the substrate to form the emitter region 308. In one example, phosphorus dopant atoms from the doping gas are doped into the surface of the substrate 302 by use of a phosphorous oxychloride ($POCl_3$) diffusion process that is performed at a relatively high processing temperature. In one example, the substrate 302 is heated in the emitter module 106 to a temperature greater than about 800° C. in the presence of a dopant containing gas to causes the doping elements in the dopant containing gas to diffuse into the surfaces of the substrate to form an emitter region. In one embodiment, the substrate is heated to a temperature between about 800° C. and about 1300° C. in the presence of phosphorus oxychloride ($POCl_3$) containing gas for between about 1 and about 120 minutes. Other examples of dopant materials may include, but are not limited to polyphosphoric acid, phosphosilicate glass precursors, phosphoric acid ($H_3PO_4$), phosphorus acid ($H_3PO_3$), hypophosphorous acid ($H_3PO_2$), and/or various ammonium salts thereof. In one embodiment, the emitter module 106 includes a rapid thermal annealing (RTA) chamber, annealing chamber, a tube furnace or belt furnace chamber.

In an alternate embodiment of block 206, the emitter region 308 may be formed by depositing or printing a dopant material in a desired pattern on the surface of the substrate 302 by the use of a deposition module, which uses screen printing, ink jet printing, spray deposition, rubber stamping, laser diffusion or other similar process to expose the front surface of the substrate 302 to the dopant, and a heater module which then drives the dopant atoms in the dopant material into the surface of the substrate in the emitter module 106. The emitter region 308 may initially be covered with a liquid, paste, or gel that is used to form heavily doped regions in the substrate 302. The substrate 302 is then heated to a temperature greater than about 800° C. to cause the dopants to drive-in or diffuse into the surface of the substrate 302 to form the emitter region 308 shown in FIG. 3C. In one embodiment, the drive-in process is performed by heating the substrate 302 to a temperature between about 800° C. and about 1300° C. for a desired period of time, for example, about 1 minute to 120 minutes. The drive-in process may be performed by any suitable heat treatment module in the emitter module 106.

In another embodiment, an optional selective emitter region (not shown) having a patterned type of heavily N++ doped region may also be formed in the emitter module 106. A patterned type of heavily doped region can be formed by conventional lithographic and ion implantation techniques, or conventional dielectric masking and high temperature furnace diffusion techniques that are well known in the art.

Figure 3D:
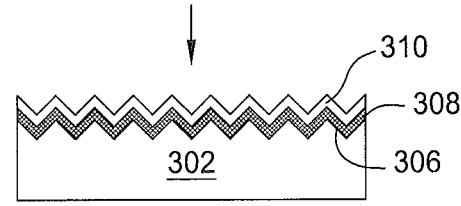

At block 208, a passivation layer 310 is formed on the emitter region 308 of the substrate 302, as shown in FIG. 3D, in a passivation layer module 108. The passivation layer 310 may optionally include a transparent conductive oxide (TCO) layer (not shown) as needed. In one example, the passivation layer 310 may be a thin passivation layer, such as silicon oxide or silicon nitride. In one embodiment, the passivation layer 310 may be a film stack having a first layer that is in contact with the emitter region 308 and a second layer that is disposed on the first layer. In one example, the first layer may comprise a silicon nitride layer formed by a plasma enhanced chemical vapor deposition (PECVD) process, in a PECVD chamber, that is between about 50 Angstroms (Å) and about 350 Å thick, such as 150 Å thick, and has a desirable quantity ($Q_1$) of trapped charge formed therein, to effectively passivate the substrate surface. In one example, the second layer may comprise a silicon nitride (SiN) layer formed by a PECVD process that is between about 400 Å and about 700 Å thick, such as 600 Å thick, which may have a desirable quantity ($Q_2$) of trapped charge formed therein, to effectively help bulk passivate the substrate surface. One will note that the type of charge, such as a positive or negative net charge based on the sum of $Q_1$ and $Q_2$, is preferentially set by the type of substrate over which the passivation layers are formed. However, in one example, a total net negative charge of between about $5 \times 10^{11}$ Coulombs/cm$^2$ to about $1 \times 10^{13}$ Coulombs/cm$^2$ would desirably be achieved over a p-type substrate surface. Alternately, in certain embodiments where a heterojunction type solar cell is desired, the passivation layer 310 may include a thin (20-100 Å) intrinsic amorphous silicon (i-a-Si:H) layer followed by an ARC layer (e.g., silicon nitride), which can be deposited using a physical vapor deposition (PVD) process or a chemical vapor deposition (CVD) process, in a PVD or CVD chamber respectively.

In another embodiment of block 208, the passivation layer 310 is formed on the emitter region 308 of the substrate 302, as shown in FIG. 3D, in a passivation layer module 108 by a wet etching/passivation process using a hydrogen fluoride gas or the like.

Figure 3E:
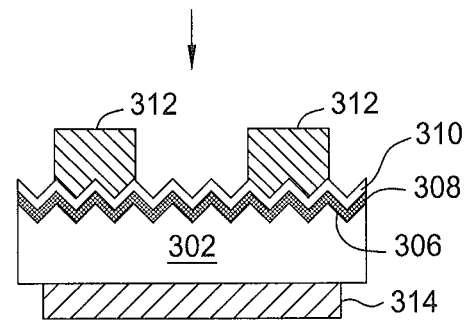

At block 210, a barrier metal contact paste 312 is selectively deposited on the passivation layer 310 to form barrier contacts in a barrier contact module 110 by use of screen printing, inkjet print, plating, chemical vapor deposition, physical vapor deposition, electro/eless or other similar processes to form and define a desired pattern where electrical contacts to the underlying substrate surface (e.g., silicon) are formed, as depicted in FIG. 3E. In one embodiment, the barrier metal contact paste 312 is disposed in a desirable pattern on the passivation layer 310 by a screen printing process in which the barrier metal contact paste 312 is printed on passivation layer 310 through a stainless steel screen. In one example, the screen printing process may be performed in a SoftLine™ system available from Applied Materials Italia S.r.l., which is a division of Applied Materials Inc. of Santa Clara, Calif. It is also contemplated that deposition equipment from other manufactures may also be utilized.

Figure 4:
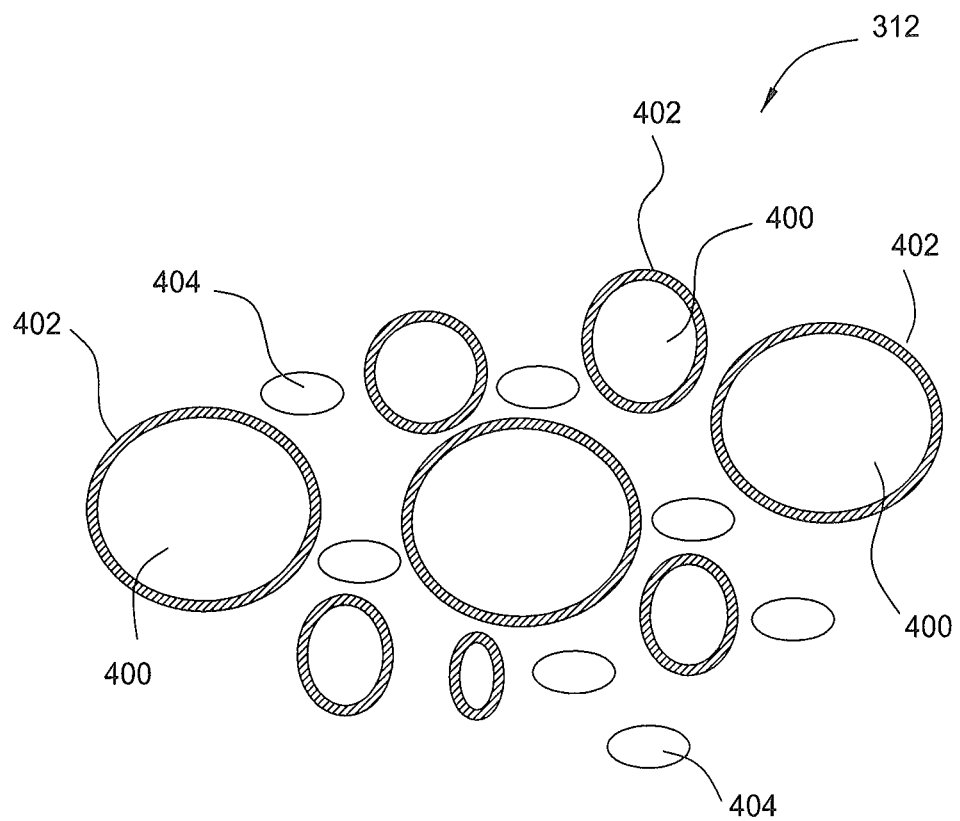
FIG. 4 is a plan view of one embodiment of a barrier metal paste.

The barrier metal contact paste 312 provided in the barrier contact module 110 is depicted in FIG. 4. In one embodiment, the barrier metal contact paste 312 may include polymer resin having at least one metal particle 400 disposed therein. The polymer and particle mixture is commonly known as "pastes" or "inks". The polymer resins act as a carrier to help enable printing of the barrier metal contact paste 312 onto the passivation layer 310. In one embodiment, the metal particle 400 found in the barrier metal contact paste 312 may be selected from nickel, tungsten, titanium, tantalum, tantalum nitride, cobalt, or other suitable metals to provide a proper conductive source for forming electrical contacts to the substrate surface through the passivation layer 310. During the fabrication of the barrier metal contact paste 312, a nitridation step, using $N_2$, $NH_3$, or a $N_2$—$H_2$ treatment (i.e., a $N_2$ and $H_2$ environment), is performed on the metal particle 400 to form a nitride layer 402 around the metal particle 400. This advantageously prevents oxidation of the barrier metal contact paste 312 during a future anneal step and allows for conductivity of the paste. Additionally, the barrier metal contact paste 312 may include a solvent or carrier gas 404. In some cases, after disposing the barrier metal contact paste 312, the substrate 302 is heated to a desirable temperature to assure that the barrier metal contact paste 312 will remain on the substrate 302, and cause the barrier metal contact paste 312 to cure with the substrate 302.

In one embodiment, at optional block 212, a back metal contact paste 314 is selectively deposited on the back side of the substrate 302 in a back metal contact module 112 by use of a screen printing, inkjet print, plating, chemical vapor deposition, physical vapor deposition, electro/eless or other similar process to form and define a desired pattern, as depicted in FIG. 3E. In one embodiment, the back metal contact paste 314 is disposed in a desirable pattern on the back side of the substrate 302 by a screen printing process in which the back metal contact paste 314 is printed on back side of the substrate 302 through a stainless steel screen. In one example, the screen printing process may be performed in a SoftLine™ system available from Applied Materials Italia S.r.l., which is a division of Applied Materials Inc. of Santa Clara, Calif. It is also contemplated that deposition equipment from other manufactures may also be utilized. In one embodiment, the back metal contact paste 314 includes aluminum particles disposed in a polymer resin that is used to form electrical contacts and back-surface-field (BSF) regions on the rear surface of a p-type substrate.

Figure 3F:
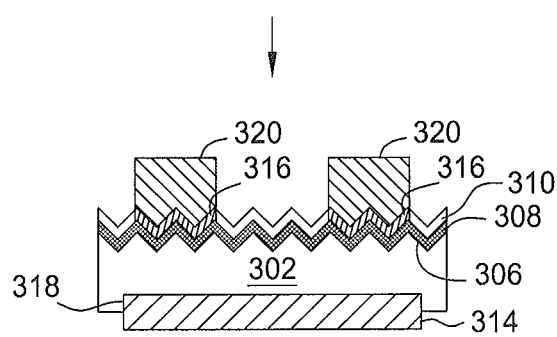

At block 214, after the barrier metal contact paste 312 is formed on the front surface of the substrate 302, a thermal processing step or a thermal anneal step is performed in a firing module 114 to cause the barrier metal contact paste 312 to densify or sinter and cause the barrier metal contact paste 312 to fire-through the passivation layer 310, and form good electrical contacts with the silicon material found in the emitter region 308, as shown in FIG. 3F. Examples of thermal processing steps include, but are not limited to, rapid thermal processing and furnace anneal using $N_2$, $NH_3$ or $N_2$—$H_2$ ambient. In one embodiment, the thermal anneal step is performed at temperature between about 400° C. and about 1,000° C., for example between about 500° C. and about 950° C. In one embodiment, the barrier metal contact paste 312 and the optional back metal contact paste 314, are formed on the front surface 304 of the substrate 302 and the back surface of the substrate 302, respectively, by a thermal processing step (e.g., a co-firing process or called a "co-fire-through" metallization process) performed simultaneously, as shown in FIG. 3F, with the same parameters as described above.

During block 214, portions of the passivation layer 310 are etched through during the firing process, by the barrier metal contact paste 312, to form front side barrier contact regions 316 that extend through the passivation layer 310. The front side barrier contact regions 316 form a partial silicide. In one embodiment, the partial silicide is between about 500 Å and 2,000 Å thick, and a remaining barrier metal 320 is between about 250 Å and 30,000 Å thick.

In one embodiment, during block 214, the back side of the substrate 302 is etched through during the co-firing process, by the back metal contact paste 314, to form a back surface contact region 318 that extends through the substrate 302.

Figure 3G:
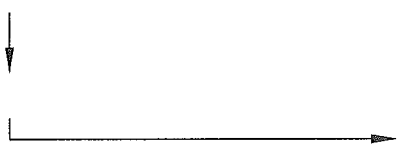

At block 218, atop metal contact paste 322 is selectively deposited on the barrier contact regions 316 to form top metal contacts in a top metal contact module 116 by use of a screen printing, inkjet print, stensil, electro/eless or other similar process to form and define a desired pattern where electrical contacts to the underlying substrate surface (e.g., silicon) are formed, as depicted in FIG. 3G. In one embodiment, block 218 is performed with little to no use of a fritz material. In one embodiment, the top metal contact paste 322 may include copper, cooper-magnesium, copper-cobalt, copper-nickel, copper-aluminum, and the like. In another embodiment, the top metal contact paste 322 may include aluminum or an aluminum alloy, aluminum-silicon, aluminum-silicon copper, and the like.

In one embodiment, the top metal contact paste 322 is disposed in a desirable pattern on the barrier contact regions 316 by a screen printing process in which the top metal contact paste 322 is printed on the barrier contact regions 316 through a stainless steel screen. In one example, the screen printing process may be performed in a SoftLine™ system available from Applied Materials Italia S.r.l. It is also contemplated that deposition equipment from other manufactures may also be utilized.

At block 218, atop metal contact paste 322 is selectively deposited on the barrier contact regions 316 to form top metal contacts in a top metal contact module 116 by use of a screen printing, inkjet print, stencil, electro/eless or other similar process to form and define a desired pattern where electrical contacts to the underlying substrate surface (e.g., silicon) are formed, as depicted in FIG. 3G. In one embodiment, block 218 is performed with little to no use of a frit material. In one embodiment, the top metal contact paste 322 may include copper, copper-magnesium, copper-cobalt, copper-nickel, copper-aluminum, and the like. In another embodiment, the top metal contact paste 322 may include aluminum or an aluminum alloy, aluminum-silicon, aluminum-silicon copper, and the like.

In one embodiment, the top metal contact paste 322 is aligned and printed to have a width greater than the barrier contact region 316, as shown in FIG. 3G. In one embodiment, the top metal contact paste 322 is aligned and printed to have a width narrower than the barrier contact region 316, as shown in FIG. 3H. In another embodiment, the top metal contact paste 322 is aligned and printed to have the same width as the barrier contact region 316. In another embodiment, the top the top metal contact paste 322 is aligned and printed to have the same width as the barrier contact region 316 disposed on an optional N++ selective emitter region.

At block 220, after the top metal contact paste 322 is formed on the barrier contact region 316, a thermal processing step or a thermal anneal step is performed in a firing furnace or firing module 114 to cause the top metal contact paste 322 to densify or sinter and cause the top metal contact paste 322 to fire-through the barrier contact region 316, and form good electrical contacts with the passivation layer 310 to form a top metal contact region 324, as shown in FIG. 3G. Examples of thermal processing steps include, but are not limited to, rapid thermal anneal, furnace cure, firing furnace and the like. In one embodiment, the thermal anneal step is performed at temperature between about 100° C. and about 900° C., for example between about 100° C. and about 400° C. and between about 300° C. and about 600° C.

Figure 5A:
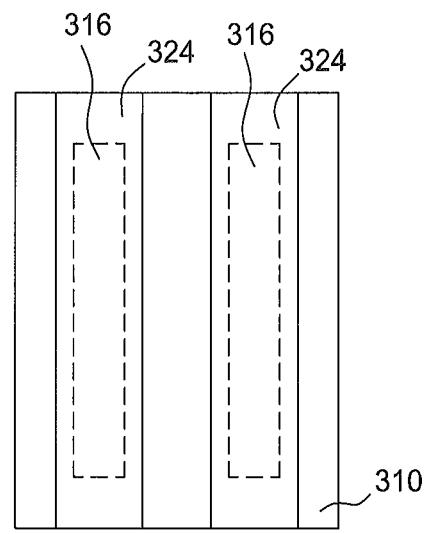
FIGS. 5A-5C depict plan views of a solar cell substrate using the processing sequence of FIG. 2 and the fabrication line of FIG. 1 according to different embodiments of the present invention.
Figure 5B:
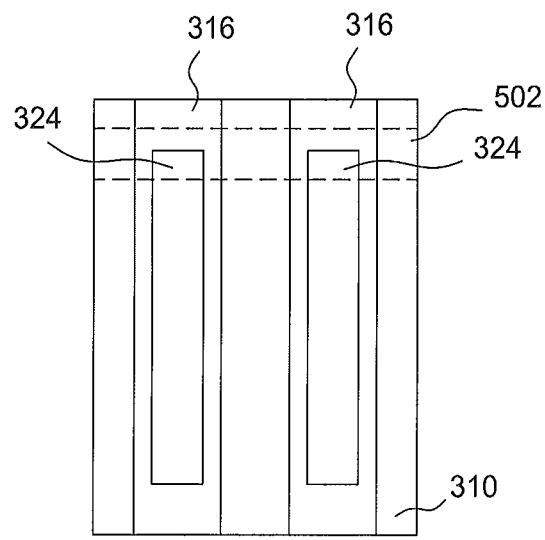
Figure 5C:
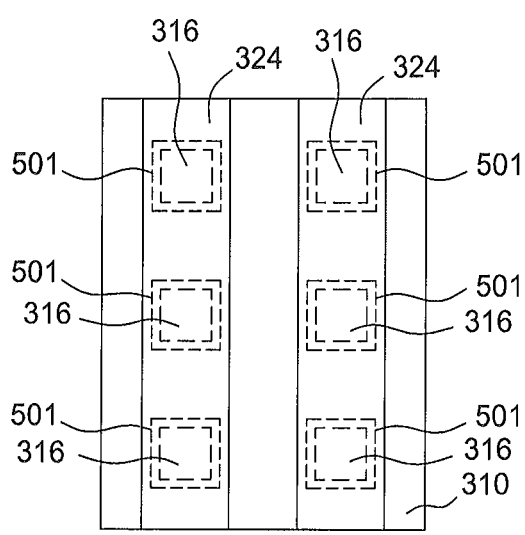

FIGS. 5A-5C depict plan views of various embodiments of a solar cell according to block 218. In one embodiment and in accordance with FIG. 3G, the top metal contact region 324 has a width greater than the underlying barrier contact region 316, as shown in FIG. 5A. In one embodiment and in accordance with FIG. 3H, the top metal contact region 324 has a width narrower than the underlying barrier contact region 316, as shown in FIG. 5B. In one embodiment, the top metal contact region 324 has a width greater than the underlying barrier contact region 316 which is selectively formed in, but not limited to, one or more rectangular shapes, as shown in FIG. 5C. In one embodiment, the top metal contact region 324 has a width greater than the underlying barrier contact region 316 which is selectively formed on an optional underlying N++ selective emitter region 501, as shown in FIG. 5C. The width of the underlying N++ selective emitter region 501 may be wider, narrower, or the same as the width of the top metal contact region 324.

In one embodiment, the top metal contact region 324 has a width of between about 30 µm to about 130 µm, for example between about 40 µm to about 120 µm, and a thickness of between about 5 µm to about 30 µm. In another embodiment, the barrier contact region 316 has a width of between about 30 µm to about 130 µm, and a length between about 1 to 20 times the width. In one embodiment, the optional N++ selective emitter region overlaps the barrier contact region 316 by about 10 µm to about 100 µm.

At block 222, a solderable strip 502 shown in phantom is provided to solder the barrier contact region 316 bus bars to the top metal contact region 324 fingers in a soldering module 118, as shown in FIG. 5B. In one embodiment, a tin/nickel or silver strip is added on the barrier contact region 316 bus bar to improve solderability.

Advantages of the above referenced fabrication line 100, processing sequence 200 and solar cell structures include: i) cost reduction by using a barrier metal contact paste and a top metal contact paste that does necessarily include costly silver and ii) reduced metal contact area for improved open circuit voltages ($V_{oc}$) and short circuit current density ($J_{sc}$).

While the foregoing is directed to embodiments of the present invention, other and further embodiments of the invention may be devised without departing from the basic scope thereof, and the scope thereof is determined by the claims that follow.

The invention claimed is:
1. A method for fabricating a solar cell comprising:
sequentially in an automated fabrication line:
doping a dopant in a substrate in a first processing module;
disposing a passivation layer on the substrate in a second processing module;
disposing a barrier metal paste on the substrate in a third processing module;
annealing the barrier metal paste to form a barrier contact region in a fourth processing module;
disposing a top metal contact paste on the barrier contact region in a fifth processing module; and
annealing the top metal contact paste to form a top metal contact region in a sixth processing module,
wherein the automated fabrication line comprises:
one or more automated substrate handlers that are positioned between each of the sequentially disposed processing modules to transfer the substrate therebetween; and a system controller that is adapted to control the transfer of the substrate between two or more of the sequentially disposed processing modules using the automated substrate handlers.

2. The method of claim 1, wherein the substrate comprises p-type crystalline silicon.

3. The method of claim 1, further comprising texturing a front side of the substrate by using an etching solution that comprises potassium hydroxide and polyethylene glycol in the automated fabrication line.

4. The method of claim 3, wherein the passivation layer comprises a film stack having a first layer in contact with an emitter region and a second layer disposed on the first layer.

5. The method of claim 4, wherein the first layer comprises silicon nitride having a thickness between about 50 Angstroms and about 150 Angstroms, and the second layer comprises silicon nitride having a thickness between about 400 Angstroms and about 700 Angstroms.

6. The method of claim 1, wherein the barrier metal paste comprises a metal particle having a metal nitride layer disposed around the metal particle, wherein the metal nitride layer comprises the same metal as the metal particle.

7. The method of claim 6, wherein the metal particle comprises nickel, tungsten, titanium, tantalum, tantalum nitride or cobalt.

8. The method of claim 7, wherein the top metal contact paste comprises copper.

9. The method of claim 7, wherein the top metal contact paste comprises aluminum.

10. The method of claim 1, wherein the top metal contact paste is disposed on the barrier contact region with little to no use of frit material.

11. The method of claim 1, wherein the doping comprises diffusing a doping gas into the substrate to form an emitter region.

12. The method of claim 1, wherein the top metal contact paste comprises copper.

13. The method of claim 1, wherein the top metal contact paste comprises aluminum.

* * * * *

UNITED STATES PATENT AND TRADEMARK OFFICE
CERTIFICATE OF CORRECTION

PATENT NO. : 9,184,333 B2  
APPLICATION NO. : 13/791067  
DATED : November 10, 2015  
INVENTOR(S) : Parikh et al.

Page 1 of 2

It is certified that error appears in the above-identified patent and that said Letters Patent is hereby corrected as shown below:

Specification

In Detailed Description:

Column 5, Line 49, please delete "electro/eless" and insert --electroless-- therefor;

Column 6, Line 26, please delete "electro/eless" and insert --electroless-- therefor;

Column 7, Line 7, please delete "atop" and insert --a top-- therefor;

Column 7, Line 10, please delete "stensil" and insert --stencil-- therefor;

Column 7, Line 10, please delete "electro/eless" and insert --electroless-- therefor;

Column 7, Line 14, please delete "fritz" and insert --frit-- therefor;

Column 7, Lines 31-44, please delete:

"At block 218, atop metal contact paste 322 is selectively deposited on the barrier contact regions 316 to form top metal contacts in a top metal contact module 116 by use of a screen printing, inkjet print, stencil, electro/eless or other similar process to form and define a desired pattern where electrical contacts to the underlying substrate surface (e.g., silicon) are formed, as depicted in Figure 3G. In one embodiment, block 218 is performed with little to no use of a frit material. In one embodiment, the top metal contact paste 322 may include copper, cooper-magnesium, copper-cobalt, copper-nickel, copper-aluminum, and the like. In another embodiment, the top metal contact paste 322 may include aluminum or an aluminum alloy, aluminum-silicon, aluminum-silicon copper, and the like." and insert:

-- In one embodiment, the top metal contact paste 322 is printed on the barrier contact region 316 by aligning one or more features in a screen printing mask to Signed and Sealed this  
Seventeenth Day of May, 2016

Michelle K. Lee  
*Director of the United States Patent and Trademark Office*

CERTIFICATE OF CORRECTION (continued)
U.S. Pat. No. 9,184,333 B2 the barrier contact region 316 using information received from the controller 102 of a determined actual position of the barrier contact region 316 on the substrate and depositing the top metal contact paste 322 through the one or more features and onto at least a portion of the barrier contact region 316 after aligning the one or more features to the barrier contact region 316.-- therefor.